March 18, 1958 P. L. JESSEN ET AL 2,827,569
STABILIZED OSCILLATOR
Filed Jan. 18, 1956
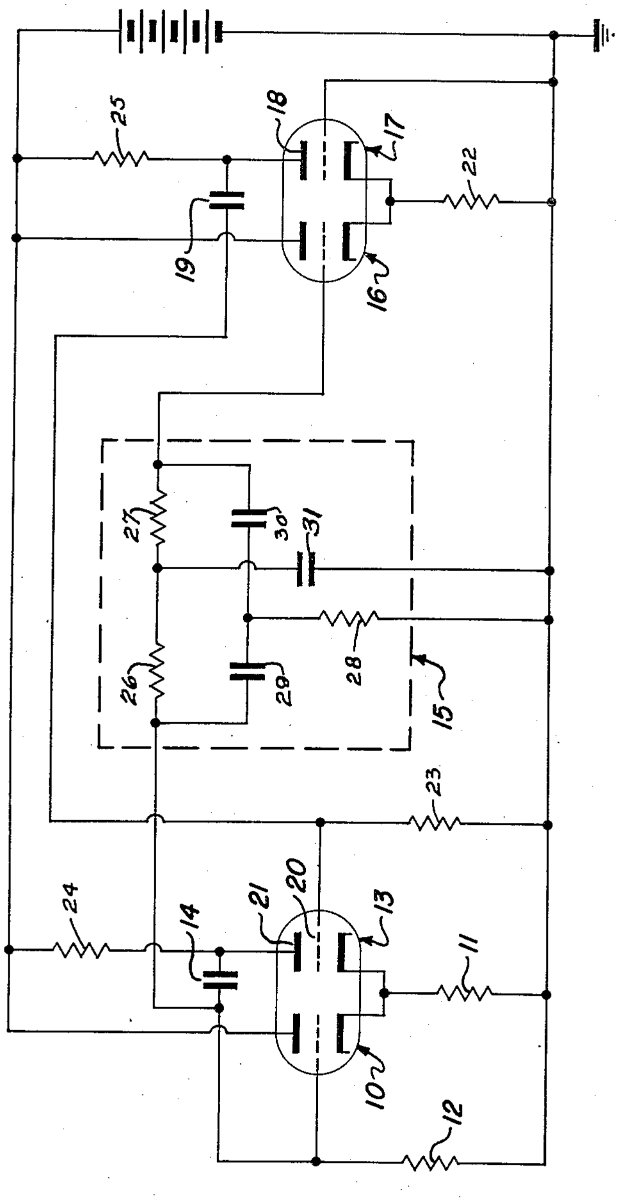
INVENTORS:
Phillip L. Jessen
Harold J. Price
BY
Roland A. Anderson
Attorney United States Patent Office 2,827,569
Patented Mar. 18, 1958

2,827,569

STABILIZED OSCILLATOR

Phillip L. Jessen, Albuquerque, N. Mex., and Harold J. Price, North Weymouth, Mass., assignors, by mesne assignments, to the United States of America as represented by the United States Atomic Energy Commission Application January 18, 1956, Serial No. 560,040
4 Claims. (Cl. 250—36)

This invention relates to oscillators, and, more particularly, to sine-wave feedback oscillators which are stabilized against changes in signal frequency due to variations in supply voltage, temperature and values of components.

Such stabilization is accomplished not only by controlling the frequency of the generated signal directly, but also by controlling the amplitude of the signal. This is because feedback oscillators inherently operate at conditions necessary for the loop gain of the system to be unity. These conditions call for a certain signal amplitude at a certain frequency. Both the amplitude and the frequency adjust themselves until unity gain is achieved, at which time oscillations can be sustained. The problem in designing a stable feedback oscillator, then, is one of insuring unity gain at the desired amplitude and frequency.

If a pure sinusoidal waveform is required, precise amplitude control is necessary also to keep the oscillator tube operating Class A. In general, purity of waveform and amplitude stability are mutually exclusive, since waveform purity depends upon the linearity of the characteristics of the amplifier tube, and amplitude stability depends upon the nonlinearity of characteristics with signal amplitude to maintain unity gain during changes in supply voltage and during component aging.

It has been found that automatic control of feedback is the best approach to the problem. Frequently, thermosensitive elements whose resistances vary with the current carried are used in the feedback loop. However, they have the disadvantage of being sensitive to changes in ambient temperature. In other systems, amplitude control is achieved by including a variable-gain feedback amplifier controlled by the rectified output of the oscillator tube. This type of control requires considerable circuitry, making it undesirable when space is a consideration.

It is an object of our invention to provide a feedback oscillator having exceptional frequency stability with changes in temperature and supply voltage.

Another object of our invention is to provide a feedback oscillator requiring few electrical components compared to the oscillators of the prior art.

A feature of our invention is a variable-gain feedback amplifier which operates in the non-linear portion of the tube characteristics, providing more gain for small signals than for large signals and thereby providing a relatively constant feedback voltage to the oscillator tube.

These and other features and objects of our invention will be better understood by reading the description to follow in conjunction with the attached drawing which shows a preferred embodiment of the invention.

Referring now to the figure, vacuum tube 10 is connected with resistors 11 and 12 to form a cathode follower circuit. Tube 13 is connected in a conventional amplifier circuit, coupled to the cathode follower by means of common cathode resistor 11. Capacitor 14 is connected as a positive-feedback loop between the amplifier and the cathode follower, causing oscillations at a frequency and amplitude at which the loop gain of the circuit is unity.

The remainder of the circuit is a negative-feedback loop designed to stabilize the frequency and amplitude at prescribed values. Network 15 is a type of electrical bridge commonly known as a "twin T" network. Our invention is not limited to the use of this network, however. Others, such as the Wien bridge and the bridged T networks, all of which are frequency selective, may be used with minor circuit changes obvious to one skilled in the art. These networks all have the characteristic, when placed in a negative-feedback loop in an oscillator circuit, of maintaining a quite pure sinusoidal waveform free of harmonics of the frequency at which the networks are designed to operate. This characteristic is due to the frequency-discriminating ability of the networks by which they pass all frequencies except the desired signal frequency through the degenerative loop. An excellent discussion of the design and use of bridge networks in oscillators is found in volume 19 of the Radiation Laboratory Series, chapter 4. The book is published by McGraw-Hill Book Company, New York.

Tubes 16 and 17 are connected in a circuit first described by Crosby in U. S. Patent 2,276,565, dated March 17, 1942. However, Crosby uses the circuit as a limiting amplifier which is effective only when the tubes are driven beyond cutoff. We choose the amplifier components so that the amplifier operates at a self-bias level near cutoff and within the nonlinear portion of the tube characteristic. The complete circuit shown in the figure is designed so that tubes 16 and 17 will not be driven beyond cutoff by possible changes in supply voltage, component values or temperature. A person skilled in the art will recognize that this form of the amplifier will result in small signals being amplified more than large signals so that there is, in effect, a smoothing of the input signal. The output of the amplifier, taken from plate 18 of tube 17, will remain quite constant in spite of changes in the input signal level. Capacitor 19 completes the negative-feedback loop by coupling plate 18 of tube 17 to grid 20 of tube 13. The stabilized output of the oscillator may be taken from plate 21 of tube 13 by capacitive coupling (not shown).

We have found that capacitor 19 is the cause of a high-frequency decaying transient superimposed on the envelope of the signal when sudden changes in the plate supply voltage occur. The transient is not generated if capacitive coupling in the negative feedback loop is replaced by direct coupling. Any of a number of direct-coupling schemes well-known in the art may be used.

We have described a stabilized oscillator which requires very few components to generate a signal whose frequency varies little with large changes in supply voltage and temperature. For example, we tested a model during simultaneous variations in plate supply voltage from 100 to 200 volts, filament voltage (normally 6.3 volts) from 5.7 to 7.8 volts, and temperature from 70° to 205° Fahrenheit. The maximum variation in signal frequency measured at plate 21 was less than two-tenths of one percent. Typical circuit values for the model tested are listed in the table below:

| Component: | Type or value |
|---|---|
| Twin-triode tube 10—13 | 6112 |
| Twin-triode tube 16—17 | 6112 |
| Resistors 11, 22 ohms | 2000 |
| Resistors 12, 23 megohms | 1 |
| Resistor 24 ohms | 4000 |
| Resistor 25 do | 50,000 |
| Resistors 26, 27 megohms | 0.2 |
| Resistor 28 do | 0.1 |
| Capacitors 14, 19 mf | 0.1 |
| Capacitors 29, 30 mmf | 3000 |
| Capacitor 31 mmf | 6000 |

Although the drawing shows tubes 10 and 13 within the same envelope, as are tubes 16 and 17, this was done merely for convenience. The tubes may as well be enclosed separately and need not be triodes to insure the stable operation described. We have described only a preferred embodiment of the invention. Changes in the circuit shown may occur to others and can be made without departing from the sphere and scope of the invention as claimed below.

We claim as our invention:

1. A stabilized oscillator comprising a first pair of thermionic electron tubes, each having at least an anode, a cathode and a control grid, the cathodes being coupled so that a variation in the cathode current of one tube causes a variation in the cathode current of the other, the anode of one tube being maintained at zero signal potential, and the anode of the other tube being coupled by an output circuit to the grid of the one tube; a second pair of thermionic electronic tubes, each having at least an anode, a cathode and a control grid, said cathodes being so coupled together that a variation in the cathode current of one tube varies the cathode current of the other, the anode of one tube and the grid of the other being maintained at zero signal potential; means for coupling a signal voltage from the anode of the other tube of the second pair to the grid of the other tube of the first pair; a frequency selective network connecting the grid of the one tube of the first pair to the grid of the one tube of the second pair, the signal conducted by said network being sufficient to locate the operating point of the second pair of tubes in the non-linear portion of the tube characteristics but insufficient to swing their control grids beyond cutoff.

2. A stabilized oscillator as in claim 1, in which the cathodes of the first pair of thermionic electron tubes are connected to ground through a first common resistor, and the cathodes of the second pair of thermionic electron tubes are connected to ground through a second common resistor.

3. A stabilized oscillator as in claim 2, in which the means for coupling a signal voltage from the anode of the other tube of the second pair to the grid of the other tube of the first pair comprises a capacitor connecting said anode to said grid, and a resistor connecting said grid to ground.

4. A stabilized oscillator as in claim 3, in which the frequency selective network comprises a twin T network.

References Cited in the file of this patent

UNITED STATES PATENTS

| | | |
|---|---|---|
| 2,444,084 | Artzt | June 29, 1948 |
| 2,568,533 | Artzt | Sept. 18, 1951 |
| 2,633,534 | Anderson | Mar. 31, 1953 |